US006876033B2

(12) United States Patent
Cappelletti et al.

(10) Patent No.: US 6,876,033 B2
(45) Date of Patent: Apr. 5, 2005

(54) ELECTRICALLY ERASABLE AND PROGRAMMABLE NON-VOLATILE MEMORY CELL

(75) Inventors: Paolo Cappelletti, Seveso (IT); Paolo Ghezzi, Rivolta D'Adda (IT); Alfonso Maurelli, Sulbiate (IT); Loris Vendrame, Carbonera (IT); Paola Zabberoni, Monza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 22 days.

(21) Appl. No.: 10/606,164

(22) Filed: Jun. 25, 2003

(65) Prior Publication Data

US 2004/0061168 A1 Apr. 1, 2004

(30) Foreign Application Priority Data

Jun. 25, 2002 (EP) .......................................... 02425416

(51) Int. Cl.[7] .......................................... H01L 29/788
(52) U.S. Cl. ...................................... 257/318; 257/314
(58) Field of Search ................................. 257/314, 315, 257/316, 317, 318, 319, 320, 321, 322, 323, 324, 325, 326; 428/201, 211, 257, 260, 202, 205

(56) References Cited

U.S. PATENT DOCUMENTS

| | | |
|---|---|---|
| 5,872,732 A | 2/1999 | Wong |
| 5,896,315 A | 4/1999 | Wong |
| 5,936,276 A * | 8/1999 | Maurelli et al. |
| 6,013,552 A * | 1/2000 | Oyama |
| 6,025,625 A | 2/2000 | Chi |
| 6,277,689 B1 | 8/2001 | Wong |

FOREIGN PATENT DOCUMENTS

| | | |
|---|---|---|
| EP | 1091408 | 4/2001 |
| WO | WO 9847150 | 10/1998 |

OTHER PUBLICATIONS

European Search Report for European Application No. 02425416.

* cited by examiner

Primary Examiner—Nathan J. Flynn
Assistant Examiner—Kevin Quinto
(74) Attorney, Agent, or Firm—Lisa K. Jorgenson; Stephen Bongini; Fleit, Kain, Gibbons, Gutman, Bongini & Bianco P.L.

(57) ABSTRACT

An electrically erasable and programmable memory cell is provided. The memory cell includes a floating gate MOS transistor and a bipolar transistor for injecting an electric charge into the floating gate. The floating gate transistor has a source region and a drain region formed in a first well with a channel defined between the drain and source regions, a control gate region, and a floating gate extending over the channel and the control gate region. The bipolar transistor has an emitter region formed in the first well, a base region consisting of the first well, and a collector region consisting of the channel. The memory cell includes a second well that is insulated from the first well, and the control gate region is formed in the second well. Further embodiments of the present invention provide a memory including at least one such memory cell, an electronic device including such a memory, and methods of integrating a memory cell and erasing a memory cell.

19 Claims, 5 Drawing Sheets

ELECTRICALLY ERASABLE AND PROGRAMMABLE NON-VOLATILE MEMORY CELL

CROSS-REFERENCE TO RELATED APPLICATIONS

This application is based upon and claims priority from prior European Patent Application No. 02425416.1, filed Jun. 25, 2002, the entire disclosure of which is herein incorporated by reference.

BACKGROUND OF THE INVENTION

1. Field of the Invention

The present invention relates to semiconductor memory devices, and more particularly to an electrically erasable and programmable non-volatile memory cell.

2. Description of Related Art

Non-volatile memories are commonly used for storing information which must be preserved even when the power supply for the memory is off. A particular type of non-volatile memory is an $E^2PROM$ (Electrically Erasable and Programmable Read-Only Memory). The $E^2PROM$ is typically formed by a matrix of memory cells, each one consisting of a floating gate MOS transistor. The transistor is programmed by injecting an electric charge into its floating gate; conversely, the transistor is erased by discharging its floating gate. The electric charge on the floating gate of the transistor modifies its threshold voltage, so as to define different logic values.

The $E^2PROMs$ have attained a widespread diffusion in the last few years (thanks to the fact that they can be programmed and erased directly in the field). Particularly, the $E^2PROMs$ are often used as embedded memories for logic circuits in several types of electronic devices (such as micro-controllers and smart cards). For this purpose, the $E^2PROM$ and the logic circuit are integrated in a single chip of semiconductor material.

However, the memory cells of the $E^2PROM$ substantially differ from the elements (such as MOS transistors) that are commonly used to implement the logic circuit. In detail, the MOS transistors require a single polysilicon layer to form their gates; conversely, the memory cells generally include two stacked polysilicon layers defining their floating gates and control gates, respectively. This structural difference increases the design and process complexity, with a detrimental impact on the manufacturing cost of the whole electronic device.

Moreover, operation of the memory cells requires (relatively) high voltages and/or currents. Particularly, the memory cells are typically programmed by Channel Hot Electron (CHE) injection. In this technique, a high voltage (for example, of 10V with respect to a reference voltage or ground) is applied between the drain and the control gate, so as to supply sufficient energy to some of the electrons flowing through a channel of the transistor to cause their injection into the floating gate. On the other hand, the memory cell is erased by Fowler-Nordheim tunneling, in which a high voltage (for example, 10V) is applied between the control gate and a substrate to remove the electric charge from the floating gate of the transistor.

In both cases, the voltages needed to program or to erase the $E^2PROM$ are far higher than a power supply voltage commonly used by the logic circuit (for example, 3–5V). This requirement adds further design complexity; moreover, charge pumps must be provided to generate the high voltages inside the chip (from the lower power supply voltage).

A different structure is described in WIPO International Patent Application Publication No. WO 98/47150. This document discloses a memory cell having a single polysilicon layer (for the floating gate). The transistor is formed in an insulated well; two diffusions define the control gate and an emitter of a lateral bipolar transistor (with the base and the collector consisting of the well and the channel, respectively). The floating gate extends over both the control gate and the emitter, so as to form two corresponding coupling capacitors. The memory cell is programmed by Substrate Hot Electron (SHE) injection. In this technique, the electrons to be injected into the floating gate are generated by the bipolar transistor (by forward biasing its base-emitter junction). The memory cell is always erased by Fowler-Nordheim tunneling, which takes place through the capacitor formed between the floating gate and the emitter.

The structure proposed in the cited document allows the use of a single process technology to manufacture both the $E^2PROM$ and the logic circuit. Moreover, the voltages required for programming the memory cells are substantially reduced.

However, this solution is not completely satisfactory. For example, the voltages needed to erase the $E^2PROM$ are still high and completely incompatible with the power supply voltage commonly used by the logic circuits.

SUMMARY OF THE INVENTION

In is an object of the present invention to overcome such drawbacks.

Another object of the present invention is to provide an improved electrically erasable and programmable non-volatile memory cell.

Briefly, one embodiment of the present invention provides an electrically erasable and programmable non-volatile memory cell. The memory cell includes a floating gate MOS transistor and a bipolar transistor for injecting an electric charge into the floating gate. The floating gate MOS transistor has a source region and a drain region formed in a first well with a channel defined between the drain region and the source region, a control gate region, and a floating gate extending over the channel and the control gate region. The bipolar transistor has an emitter region formed in the first well, a base region consisting of the first well, and a collector region consisting of the channel. The memory cell includes a second well that is insulated from the first well, and the control gate region is formed in the second well.

Moreover, further embodiments of the present invention provide a memory including at least one such memory cell, and an electronic device including such a memory.

Still other embodiments of the present invention provide a method of integrating a memory cell and a method of erasing a memory cell.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1:
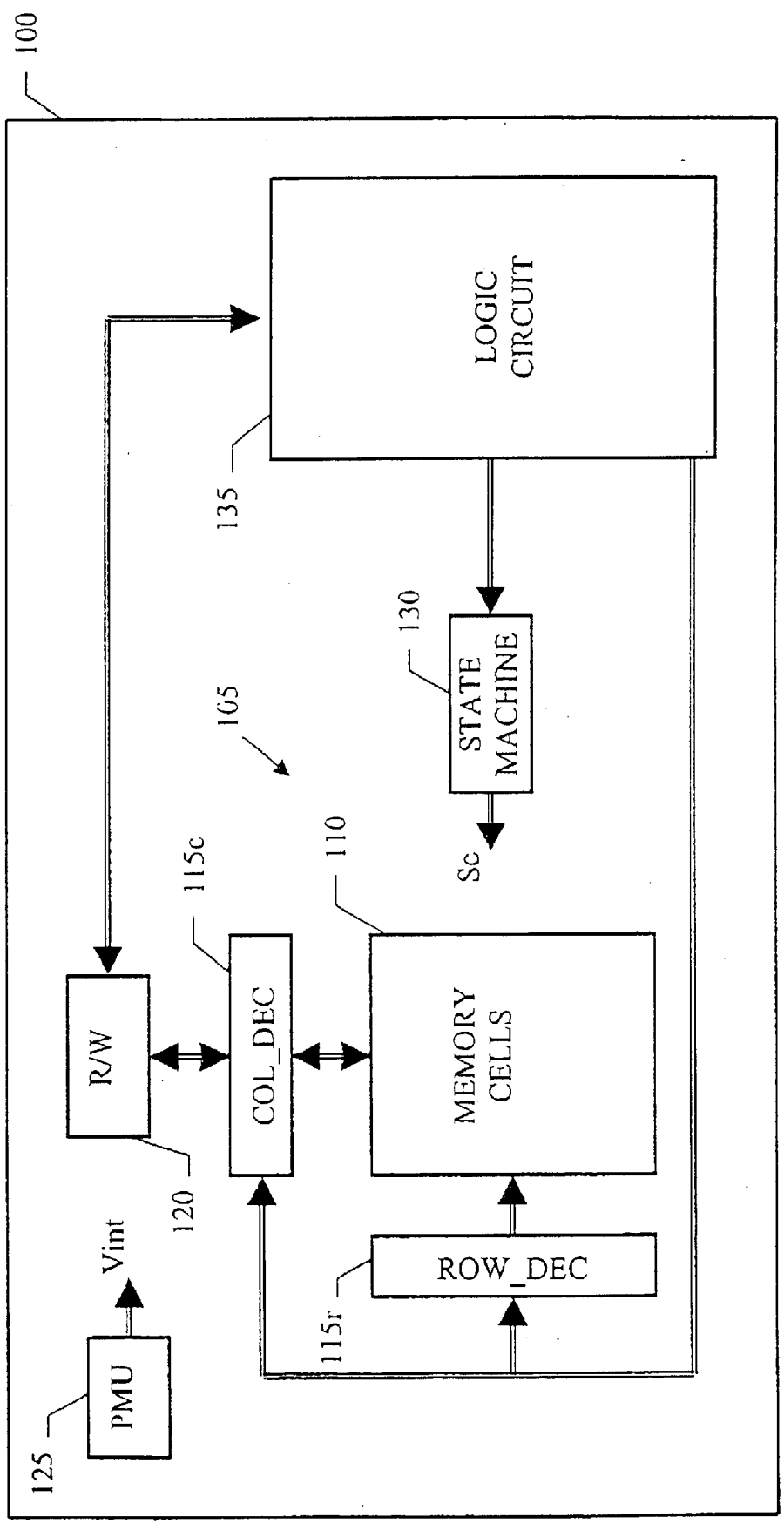
FIG. 1 is a block diagram of an electronic device that can include memory cells according to embodiments of the present invention.

FIG. 1 shows an electronic device. The electronic device 100 includes an E$^2$PROM 105, which is formed by a matrix 110 of memory cells, each one storing a bit of information. The memory cells are arranged in a plurality of rows and columns (for example, 16 rows and 256 columns).

A row decoder (ROW_DEC) 115r and a column decoder (COL_DEC) 115c are used to select the rows and the columns, respectively, of the matrix 110. The column decoder 115c is connected to a read/write unit (R/W) 120. The unit 120 outputs a word (for example, of 8 bits) read from the matrix 110. Moreover, the unit 120 receives a word to be written into the matrix 110, and drives the column decoder 115c accordingly. The read/write unit 120 includes all the components (such as sense amplifiers, comparators, reference cells, pulse generators, and the like) that are used for writing the memory cells or for reading their values.

A power management unit (PMU) 125 receives an external power supply voltage (for example, 5V relative to ground). The power management unit 125 generates a plurality of internal supply voltages (denoted as a whole with Vint) that are used for operating the E$^2$PROM 105. The E$^2$PROM 105 is controlled by a state machine 130, which outputs a plurality of signals (denoted as a whole with Sc) in response to corresponding external commands.

The E$^2$PROM 105 interfaces with a further section of the electronic device 100 consisting of a logic circuit 135. The logic circuit 135 provides the external commands to the state machine 130. Moreover, the logic circuit 135 supplies a row address and a column address (to the row decoder 115r and to the column decoder 115c, respectively) for selecting the memory cells of the matrix 110. The logic circuit 135 is also connected to the read/write unit 120 for receiving the word read from the matrix 110 and for providing the word to be written therein. For example, in one exemplary embodiment the logic circuit 135 consists of a micro-controller, and the E$^2$PROM 105 is used to store a code identifying the electronic device 100 or information about redundancy addresses of volatile memories (not shown) typically embedded in the electronic device 100.

Similar considerations apply if the electronic device has another structure or includes equivalent or similar units, if the matrix has a different number of rows and/or columns, if the E$^2$PROM is of a multi-level type (with each memory cell storing multiple bits), if the logic circuit and the E$^2$PROM are used for a different purpose, and so on.

Figure 2:
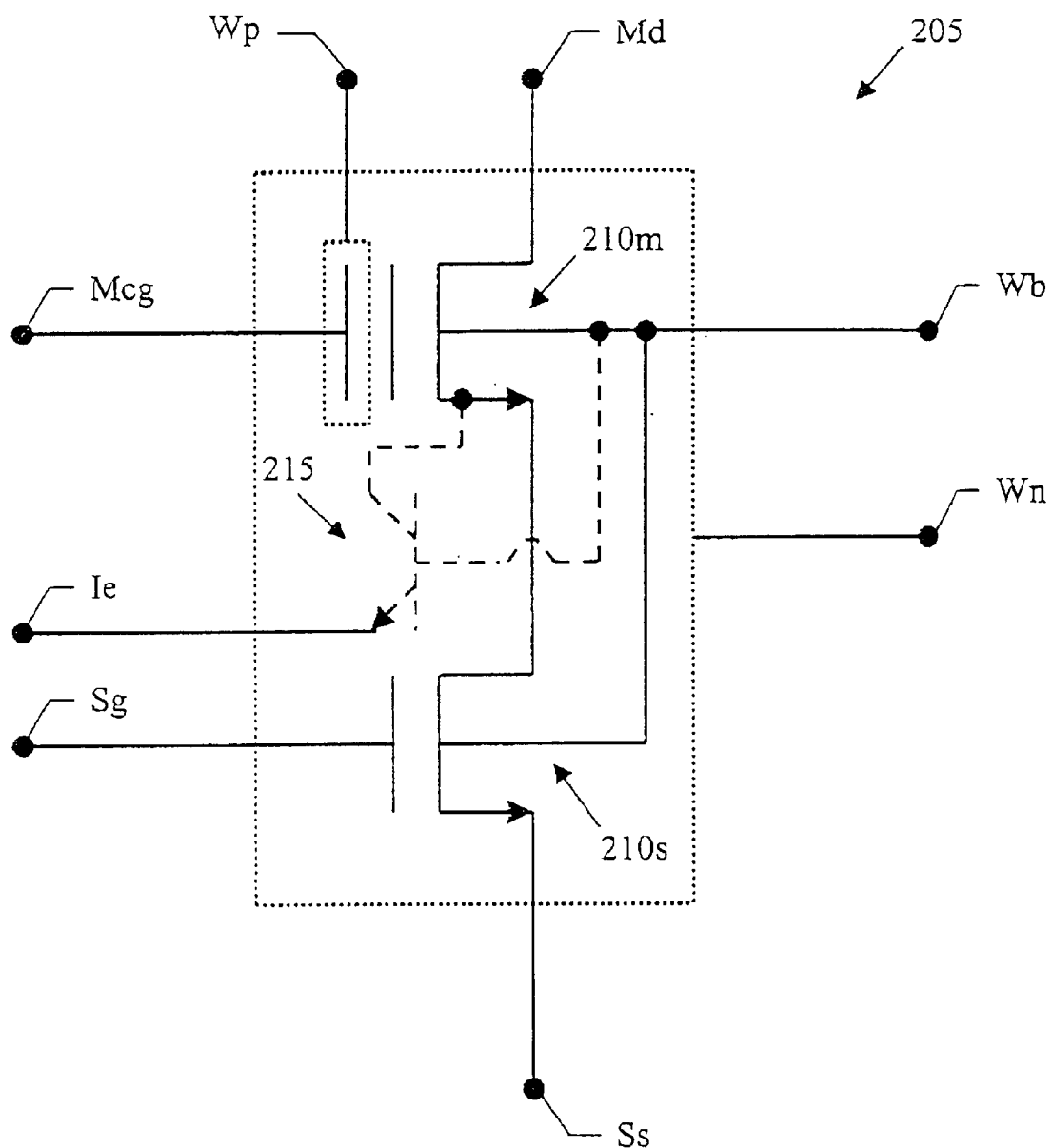
FIG. 2 is an equivalent circuit for a memory cell of a preferred embodiment of the present invention.

FIG. 2 shows a generic memory cell 205 according to a preferred embodiment of the present invention. Such a memory cell can be used in the E$^2$PROM of the electronic device of FIG. 1. The memory cell 205 includes a sense transistor 210m (used to store the bit of information) and a select transistor 210s (used to select the corresponding sense transistor 210m).

The sense transistor 210m consists of an N-channel floating gate MOS transistor. The control gate terminals Mcg of the sense transistors 210m of each row are connected to a corresponding word line (driven by the row decoder). The drain terminals Md of the sense transistors 210m of each column are connected to a corresponding bit line (driven by the column decoder).

The select transistor 210s consists of an N-channel MOS transistor. The drain terminal of the select transistor 210s is connected to the source terminal of the sense transistor 210m. The gate terminals Sg of the select transistors 210s of each row are connected to a corresponding select line (driven by the row decoder). The source terminals Ss of all the select transistors 210m are connected to a common source line.

As described in detail below, the sense transistor 210m and the select transistor 210s have a common body terminal Wb. Another terminal Wp contacts a well in which the control gate of the sense transistor 210m is made. The whole memory cell is formed in a further well, which is contacted by another terminal Wn. The terminals Wb, the terminals Wp, and the terminals Wn of the memory cells of each row are connected to corresponding lines (driven by the row decoder).

The sense transistor 210m in a non-programmed condition has a low threshold voltage. Therefore, when the sense transistor is selected, a current flows through the corresponding bit line (for example, representing a logic value 1). The sense transistor 210m is programmed by injecting an electric charge into its floating gate. In this condition, the sense transistor 210m has a high threshold voltage. Therefore, when the transistor is selected, no current flows through the corresponding bit line (for example, representing a logic value 0). As described in detail below, an NPN bipolar transistor 215 is used to inject the electric charge into the floating gate of the sense transistor 210m. The emitter terminals Ie of the injection transistors 215 of each row are connected to a corresponding programming line (driven by the row decoder).

Similar considerations apply if the memory has a different architecture, if the N-channel MOS transistors and the NPN bipolar transistors are replaced with P-channel MOS transistors and PNP bipolar transistors, respectively, and so on. In an alternative embodiment, the memory cell does not include any select transistor so as to be used in a flash E$^2$PROM (in which the memory cells are erased in blocks).

Figure 3A:
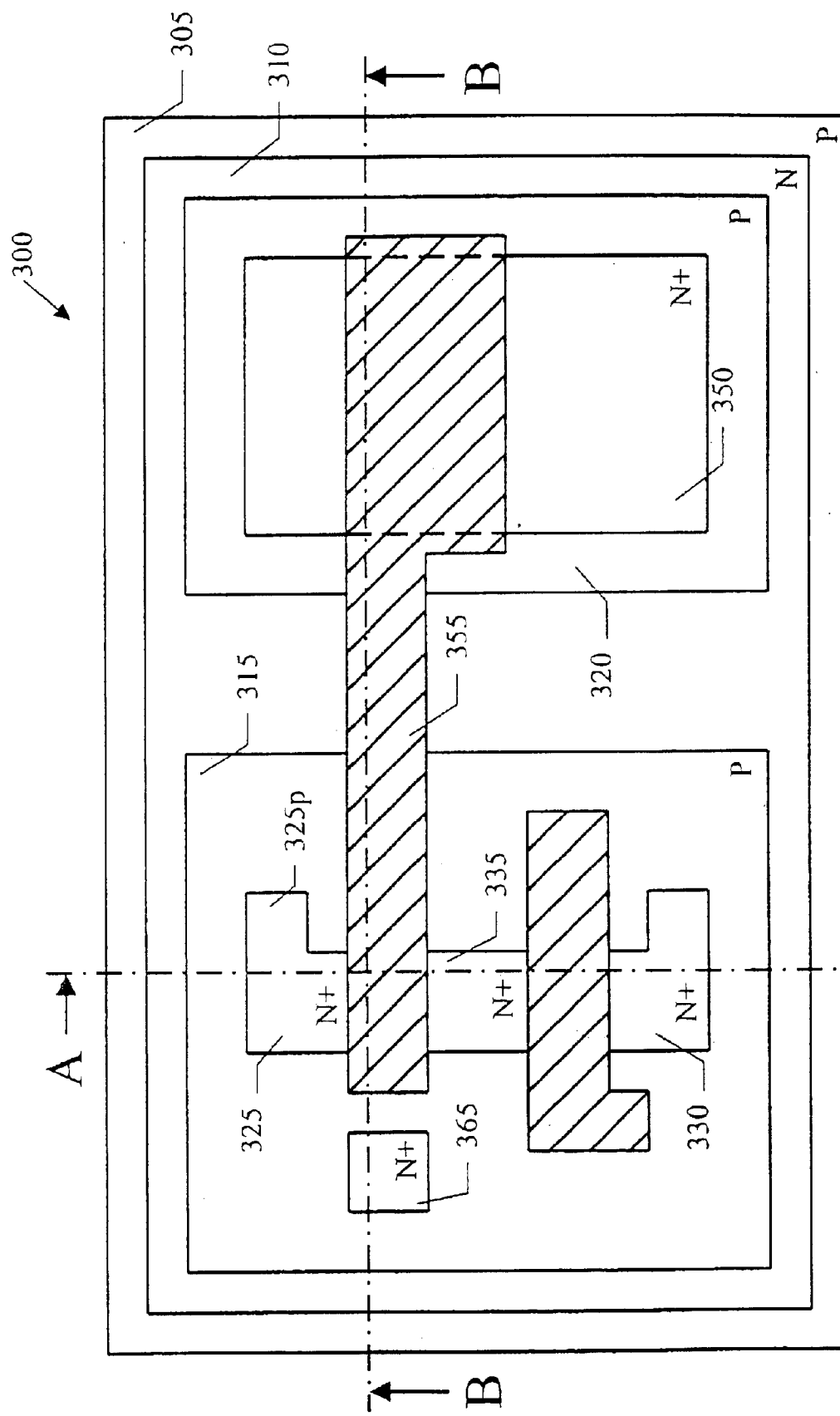
FIG. 3a is a top plan view showing the layout of the memory cell of the preferred embodiment.
Figure 3B:
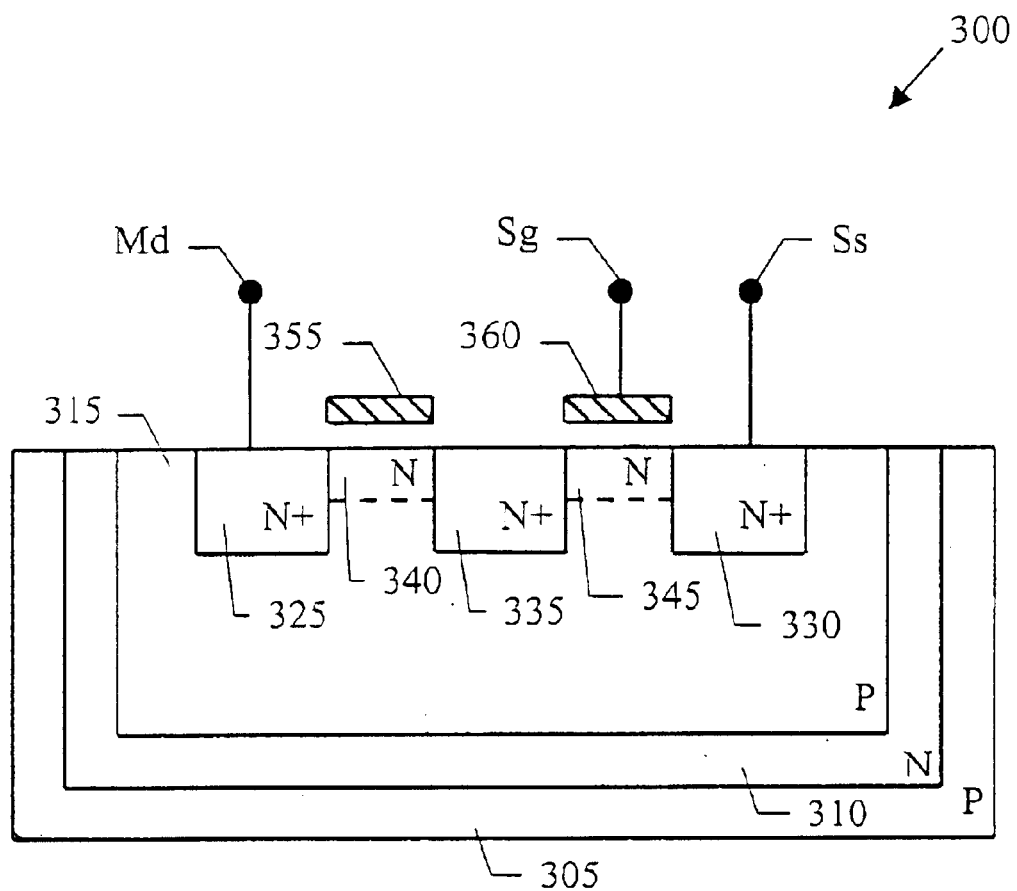
FIGS. 3b and 3c are cross sections of the memory cell of the preferred embodiment taken along plane A—A and plane B—B, respectively.
Figure 3C:
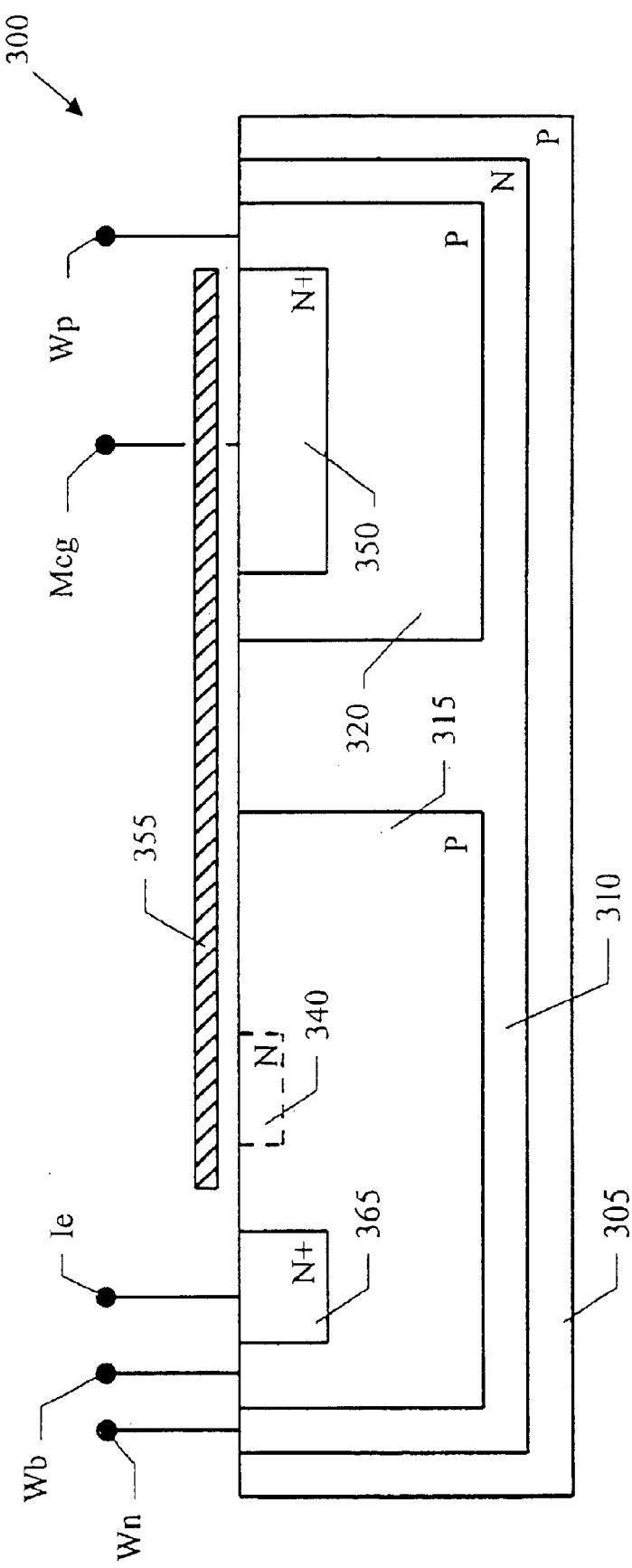

FIGS. 3a–3c show an electronic device integrated in a chip 300 of semiconductor material. Typically, the same structure is formed in large numbers in several identical areas of a wafer of semiconductor material, which are subsequently separated by a cutting operation. As usual, the concentrations of N-type and P-type impurities (or dopant) are denoted by adding the sign + or the sign − to the letters N and P to indicate a high or low concentration of impurities, respectively. The letters N and P without the addition of a sign denote concentrations of intermediate value.

The chip 300 includes a substrate 305 of the P-type (which is typically at the lowest voltage available in the electronic device). Each memory cell is formed in a well 310 of the opposite type of conductivity (N), so as to be insulated from the substrate 305 when the corresponding P-N junction is reverse biased. Particularly, the N-well 310 consists of a buried layer (formed with a high energy implantation process) and a contact ring, to which the terminal Wn (made of a metal track) is connected. Two further wells 315 and 320 of the P-type extend into the N-well 310; two metal tracks contacting the P-well 315 and the P-well 320 (through corresponding diffusions with high concentration of impurities) define the terminal Wb and the terminal Wp, respectively.

The P-well 315 forms a body (or bulk) for the sense transistor and the select transistor. A diffusion 325 of the N+ type defines a drain region of the sense transistor, and a diffusion 330 of the N+ type defines a source region of the select transistor; a common region 335 of the N+ type operates as both a source region of the sense transistor and a drain region of the select transistor. Two metal tracks contacting the drain region 325 and the source region 330 form the drain terminal Md of the sense transistor and the source terminal Ss of the select transistor, respectively. In this way, a channel 340 consisting of an inversion layer of the N-type is formed between the regions 325 and 335 during operation of the sense transistor, and a channel 345 (of the N-type) is likewise formed between the regions 330 and 335 during operation of the select transistor.

The sense transistor has a distinct control gate region 350, which consists of a diffusion of the N+ type made in the P-well 320; a further metal track contacting the control gate region 350 defines the control gate terminal Mcg. The floating gate of the sense transistor consists of a polysilicon layer 355, which is electrically insulated from the semiconductor material by an oxide layer. The floating gate 355 extends over the channel 340 and the control gate region 350. The floating gate is separated from the channel 340 and the control gate region 350 by a thin oxide, and is separated from the other regions of the chip 300 by a (thick) field oxide. A further insulated polysilicon layer 360 extending over the channel 345 forms the gate of the select transistor, which is contacted by the gate terminal Sg.

A diffusion of the N+ type 365 extends in the P-well 315; the diffusion 365 defines an emitter region of the injection transistor. A metal track contacting the emitter region 365 forms the emitter terminal Ie. The injection transistor has a lateral structure defined by the emitter region 365 (of the N-type), the P-well 315 (acting as a base), and the N-channel 340 (acting as a collector).

The layout of the memory cell described above is preferably optimized so as to minimize the recombination of electrons in the base of the injection transistor. For this purpose, the emitter region 365 is arranged as close as possible to the channel 340 (consistently with the design constraints). The drain region 325 and the source region 335 are very small, in order to reduce the amount of electrons that are collected instead of being injected into the floating gate 355 through the channel 340. Moreover, the emitter region 365 is closer to the channel 340 than to the drain region 325 and to the source region 335. Particularly, in plan view the drain region 325 is substantially rectangular-shaped; a protrusion 325p projects asymmetrically with respect to a longitudinal axis of the channel 340 (parallel to the plane A—A) to define a corresponding contact region for the drain terminal Md. As shown in the figure, the emitter region 365 and the protrusion 325p are arranged at opposite sides of the longitudinal axis of the channel 340.

A stray (vertical) bipolar transistor NPN is formed by the region 365 of the N-type (acting as an emitter), the P-well 315 (base), and the N-well 310 (collector). This stray transistor shunts part of the electrons (passing through the P-well 315) to the N-well 310. In order to not adversely affect operation of the memory cell, the gain of the stray transistor is reduced as much as possible (for example, by having the distance between the emitter region 365 and the N-well 310 be greater than the distance between the same emitter region 365 and the channel 340).

During a programming procedure, all the select transistors are switched off by taking the gate terminals Sg to ground (with the source terminals Ss left floating). The drain terminals Md of one or more selected columns are biased to a voltage of 3.5V (while the drain terminals of the other columns are kept at ground). The control gate terminals Mcg of a selected row are biased to a voltage of 5V (while the control gate terminals of the other rows are kept at ground). In this way, the portion over the channel 340 of each corresponding floating gate 355 is brought to a voltage close to 5V by capacitive coupling (which voltage is a function of the voltage in the control gate region 350, the capacitance of a capacitor formed between the control gate region 350 and the floating gate 355, and the capacitance of a capacitor formed between the floating gate 355 and the channel 340). As a consequence, the portion of the P-well 315 under the floating gate 355 is inverted, creating the N-channel 340 (which is at the same voltage as the drain region 325). All the terminals Wb are kept at ground; the terminals Wp and the terminals Wn of the selected row are brought to a voltage of 3.5V (while the terminals Wp and Wn of the other rows are kept at ground), so as to reverse bias the corresponding P-N junctions.

The selected memory cells are programmed by SHE injection. For this purpose, the emitter terminals Ie of the selected row are brought to a voltage of −0.7V, so as to forward bias the respective base-emitter junction formed with the P-well 315 (while the emitter terminals Ie of the other rows are kept at ground). In this way, substrate electrons are generated and part of them diffuses through the P-well 315 to the N-channel 340. The substrate electrons that reach the N-channel 340 are accelerated by an electric field defined by the potential difference between the N-channel 340 (3.5V) and the P-well 315 (0V). Some of the electrons (referred to as hot electrons) gain sufficient energy, in excess of an oxide barrier potential, to be injected into the floating gate 355; the electric charge transferred into the floating gate 355 is retained for any practical time period. Conversely, in the other memory cells of the matrix (which are not to be programmed) the electric field is lower than the oxide barrier potential, so that the electrons do not gain sufficient energy to be injected into the floating gate.

During an erasure procedure, the gate terminals Sg of a selected row are brought to a voltage of 3.5V (while the gate terminals Sg of the other rows are kept at ground). The source terminals Ss of all the select transistors are left floating. At the same time, the drain terminals Md of all the sense transistors are left floating. The control gate terminals Mcg of the selected row are biased to a voltage of −5V (while the control gate terminals of the other rows are kept at ground). In this way, each corresponding floating gate 355 is brought to a voltage close to −5V by capacitive coupling. The terminals Wb of the selected row are then brought to a voltage of 5V (while the terminals Wb of the other rows are kept at ground). All the emitter terminals Ie are left floating. The terminals Wp of the selected row are brought to a voltage of −5V (while the terminals Wp of the other rows are kept at ground). At the same time, the terminals Wn of the selected row are biased to a voltage of 5V (while the terminals Wn of the other rows are kept at ground).

The resulting electric field between the floating gate 355 and the P-well 315 generates a low Fowler-Nordheim current by quantum-mechanical tunneling, which current removes the electric charge from the floating gate 355 of the sense transistor. Conversely, the other memory cells of the matrix (which are not to be erased) are not subjected to a biasing condition suitable for removing the electric charge from the floating gate.

It should be noted that the erasure procedure described above (in which the voltage applied to the control gate terminal Mcg and the voltage applied to the P-well 315 are of opposite signs) is made possible by the provision of two distinct P-wells 315 and 320 that are insulated from each other (through the N-well 310). As a matter of fact, the P-well 320 must be biased to a voltage of −5V to ensure that the P-N junction formed with the control gate region 350 is reverse biased. This is possible only if the P-well 320 is separated from the P-well 315 (biased to a voltage of 5V).

Reading is accomplished by bringing the gate terminals Sg of a selected row to a voltage of 1V (while the gate terminals of the other rows at kept at ground); the source terminals Ss of all the select transistors are kept at ground. The drain terminals Md of one or more selected columns are brought to a voltage of 1V (while the drain terminals of the other columns are kept at ground). Moreover, the control gate terminals Mcg of the selected row are brought to a voltage of 5V (while the control gate terminals of the other rows are kept at ground). In this way, each corresponding floating gate 355 is brought to a voltage close to 5V by capacitive coupling. At the same time, all the emitter terminals Ie are left floating; all the terminals Wb, all the terminals Wp, and all the terminals Wn are kept at ground.

In this way, the select transistor of each desired memory cell is switched on. If the corresponding sense transistor is non-programmed it features a low threshold voltage; therefore, a current flows through the respective bit line so that a first logic value (for example, 1) is detected by the read/write unit (by comparing the current on the bit line with a current supplied by a corresponding reference cell). On the other hand, if the sense transistor is programmed it features a high threshold voltage; therefore, the sense transistor is non-conductive and no current flows through the respective bit line, so that a second logic value (for example, 0) is detected.

The following table summarizes operation of this exemplary E²PROM:

|     | Program |        | Erase  |        | Read   |        |
| --- | ------- | ------ | ------ | ------ | ------ | ------ |
|     | Sel.    | Unsel. | Sel.   | Unsel. | Sel.   | Unsel. |
| Sg  | 0 V     | 0 V    | 3.5 V  | 0 V    | 1 V    | 0 V    |
| Ss  | Float   | Float  | Float  | Float  | 0 V    | 0 V    |
| Md  | 3.5 V   | 0 V    | Float  | Float  | 1 V    | 0 V    |
| Mcg | 5 V     | 0 V    | −5 V   | 0 V    | 5 V    | 0 V    |
| Wb  | 0 V     | 0 V    | 5 V    | 0 V    | 0 V    | 0 V    |
| Wp  | 3.5 V   | 0 V    | −5 V   | 0 V    | 0 V    | 0 V    |
| Wn  | 3.5 V   | 0 V    | 5 V    | 0 V    | 0 V    | 0 V    |
| Ie  | −0.7 V  | 0 V    | Float  | Float  | Float  | Float  |

Similar considerations apply if the memory cell is formed with a different process, if the floating gate is made of an equivalent conductive material, if the regions of the N-type are replaced with regions of the P-type and vice-versa, if the memory cell is programmed by injection of other carriers (hot holes), and so on.

More generally, embodiments of the present invention propose an electrically erasable and programmable non-volatile memory cell, which is integrated in a chip of semiconductor material. The memory cell includes a floating gate MOS transistor. The MOS transistor has a source region and a drain region formed in a first well; a channel is defined between the drain region and the source region during operation of the memory cell. The MOS transistor further has a control gate region, and a floating gate extending over the channel and the control gate region. The memory cell also includes a bipolar transistor for injecting an electric charge into the floating gate. The bipolar transistor has an emitter region formed in the first well, a base region consisting of the first well, and a collector region consisting of the channel. In this memory cell, a second well insulated from the first well is provided. The control gate region is formed in the second well.

Such a structure strongly improves the effectiveness of the memory cell. Particularly, the present invention makes it possible to reduce the voltages required for erasure of the memory cell.

In order to achieve this result, a larger area of the chip is used to integrate the memory cell (for example, on the order of 10 $\mu m^2$). Moreover, the operative speed of the memory cell is relatively low (on the order of 100–200 $\mu s$). In any case, this is more than compensated for by the aforementioned advantages for many applications.

The preferred embodiment of the present invention described above offers further advantages. For example, the two P-wells are formed in a single N-well (consisting of a buried layer and a corresponding contact ring). This structure is quite simple, but at the same time effective. Further, the emitter region is advantageously free of any overlaying floating gate. In this way, the memory cell is erased by discharging its floating gate through the oxide over the channel. This feature improves the operation of the memory cell (compared with the memory cell described in WIPO International Patent Application Publication No. WO 98/47150, in which the floating gate is discharged through the capacitor formed between the floating gate and the emitter).

In a preferred embodiment of the present invention, the emitter region is closer to the channel than to the drain region and to source region. The proposed layout minimizes the recombination of electrons in the base of the injection transistor. As a further improvement, the emitter region and any protrusion of the drain region and/or source region are arranged at opposite sides of a longitudinal axis of the channel. This design feature improves the effectiveness of the injection transistor in a very simple manner.

Alternatively, the P-wells are insulated in a different manner, the floating gate also extends over the emitter region (or a part thereof), the drain region or the source region have another shape (possibly without any protrusion), or a different layout is envisaged for the memory cell.

Typically, a matrix of memory cells as described above is used in a non-volatile memory.

In a preferred embodiment of the present invention, each memory cell is erased by applying voltages of opposite signs to the control gate region and the P-well. These voltages may be generated from the power supply voltage in a very simple manner (generally without requiring any charge pump).

The present invention is particularly advantageous in an electronic device including a memory and a logic circuit, which are integrated in a single chip. As a matter of fact, a standard technology can be used to integrate both the E²PROM and the logic circuit in the same chip. Moreover, the voltages required to operate (program and erase) the E²PROM are substantially compatible with the power supply voltage used by the logic circuit. In this way, the design and process complexity is greatly reduced; as a consequence, the electronic device can be manufactured at very low cost.

The present invention also leads itself to be implemented in a memory consisting of a single element, in a structure using different voltages for erasing the memory cells, or in alternative applications (even without any logic circuit integrated in the same chip).

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An electrically erasable and programmable non-volatile memory cell integrated in a chip of semiconductor material, said memory cell comprising:
    a floating gate MOS transistor having a source region and a drain region formed in a first well with a channel defined between the drain region and the source region, a control gate region, and a floating gate extending over the channel and the control gate region; and
    a bipolar transistor for injecting an electric charge into the floating gate, the bipolar transistor having an emitter region formed in the first well, a base region consisting of the first well, and a collector region consisting of the channel,
    wherein the memory cell includes a second well that is insulated from the first well, and
    the control gate region is formed in the second well.

2. The memory cell according to claim 1,
    wherein the first well and the second well have a first type of conductivity,
    the memory cell further includes a third well having a second type of conductivity, which is opposite the first type of conductivity, and
    the first well and the second well are formed in the third well.

3. The memory cell according to claim 2, wherein the floating gate does not extend over the emitter region.

4. The memory cell according to claim 3, wherein a distance between the emitter region and the channel is less than a distance between the emitter region and the source region and less than a distance between the emitter region and the drain region.

5. The memory cell according to claim 1, wherein the floating gate does not extend over the emitter region.

6. The memory cell according to claim 1, wherein a distance between the emitter region and the channel is less than a distance between the emitter region and the source region and less than a distance between the emitter region and the drain region.

7. The memory cell according to claim 6,
    wherein at least one of the drain region and the source region has at least one protrusion projecting asymmetrically with respect to a longitudinal axis of the channel, and
    the emitter region is arranged at a first side of the longitudinal axis and the at least one protrusion is arranged at an opposite second side of the longitudinal axis.

8. An electrically erasable and programmable non-volatile memory including at least one memory cell, the at least one memory cell comprising:
    a floating gate MOS transistor having a source region and a drain region formed in a first well with a channel defined between the drain region and the source region, a control gate region, and a floating gate extending over the channel and the control gate region; and
    a bipolar transistor for injecting an electric charge into the floating gate, the bipolar transistor having an emitter region formed in the first well, a base region consisting of the first well, and a collector region consisting of the channel,
    wherein the memory cell includes a second well that is insulated from the first well, and
    the control gate region is formed in the second well.

9. The memory according to claim 8,
    wherein the first well and the second well of the at least one memory cell have a first type of conductivity,
    the at least one memory cell further includes a third well having a second type of conductivity, which is opposite the first type of conductivity, and
    the first well and the second well are formed in the third well.

10. The memory according to claim 8, wherein the floating gate of the at least one memory cell does not extend over the emitter region.

11. The memory cell according to claim 8, wherein a distance between the emitter region and the channel of the at least one memory cell is less than a distance between the emitter region and the source region and less than a distance between the emitter region and the drain region.

12. The memory according to claim 11,
    wherein at least one of the drain region and the source region of the at least one memory cell has at least one protrusion projecting asymmetrically with respect to a longitudinal axis of the channel, and
    the emitter region of the at least one memory cell is arranged at a first side of the longitudinal axis and the at least one protrusion is arranged at an opposite second side of the longitudinal axis.

13. The memory according to claim 8, further including means for applying a first voltage to the first well and a second voltage to the control gate region of at least one selected memory cell during an erasure procedure, the first voltage and the second voltage being of opposite signs.

14. An electronic device including an electrically erasable and programmable non-volatile memory and a logic circuit integrated in a chip of semiconductor material, the memory including at least one memory cell that includes:
    a floating gate MOS transistor having a source region and a drain region formed in a first well with a channel defined between the drain region and the source region, a control gate region, and a floating gate extending over the channel and the control gate region; and
    a bipolar transistor for injecting an electric charge into the floating gate, the bipolar transistor having an emitter region formed in the first well, a base region consisting of the first well, and a collector region consisting of the channel,
    wherein the memory cell includes a second well that is insulated from the first well, and
    the control gate region is formed in the second well.

15. The electronic device according to claim 14, wherein the memory further includes means for applying a first voltage to the first well and a second voltage to the control gate region of at least one selected memory cell during an erasure procedure, the first voltage and the second voltage being of opposite signs.

16. A method of integrating an electrically erasable and programmable non-volatile memory cell in a chip of semiconductor material, the method including the steps of:

providing a first well;

providing a floating gate MOS transistor having a source region and a drain region formed in a first well with a channel defined between the drain region and the source region, a control gate region, and a floating gate extending over the channel and the control gate region;

providing a bipolar transistor for injecting an electric charge into the floating gate, the bipolar transistor having an emitter region formed in the first well, a base region consisting of the first well, and a collector region consisting of the channel; and providing a second well insulated from the first well, the control gate region being formed in the second well.

17. The method according to claim 16, further including the step of:

providing a third well having a first type of conductivity, wherein the first well and the second well have a second type of conductivity, which is opposite the first type of conductivity, and the first well and the second well are formed in the third well.

18. The method according to claim 16, wherein in the step of providing a floating gate MOS transistor, the floating gate is formed so as to not extend over the emitter region.

19. A method of erasing an electrically erasable and programmable non-volatile memory cell integrated in a chip of semiconductor material, the memory cell including:

a floating gate MOS transistor having a source region and a drain region formed in a first well with a channel defined between the drain region and the source region, a control gate region, and a floating gate extending over the channel and the control gate region, the control gate region being formed in a second well insulated from the first well; and a bipolar transistor for injecting an electric charge into the floating gate, the bipolar transistor having an emitter region formed in the first well, a base region consisting of the first well, and a collector region consisting of the channel, the method including the steps of:

applying a first voltage to the first well; and applying a second voltage to the control gate region so as to provide an erasure voltage between the first well and the control gate region for removing an electric charge from the floating gate, the first voltage and the second voltage being of opposite signs.

* * * * *